United States Patent
Fang et al.

(10) Patent No.: US 9,240,418 B2
(45) Date of Patent: Jan. 19, 2016

(54) WORDLINE RESISTANCE REDUCTION METHOD AND STRUCTURE IN AN INTEGRATED CIRCUIT MEMORY DEVICE

(75) Inventors: Shenqing Fang, Fremont, CA (US); Jihwan Choi, San Mateo, CA (US); Connie Wang, Mountain View, CA (US); Eunha Kim, Menlo Park, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/961,379

(22) Filed: Dec. 6, 2010

(65) Prior Publication Data

US 2011/0095370 A1 Apr. 28, 2011

Related U.S. Application Data

(62) Division of application No. 12/111,886, filed on Apr. 29, 2008, now Pat. No. 7,867,899.

(51) Int. Cl.
*H01L 21/00* (2006.01)
*H01L 27/115* (2006.01)
*G11C 5/06* (2006.01)
*H01L 27/105* (2006.01)
*H01L 29/66* (2006.01)
*H01L 21/8234* (2006.01)

(52) U.S. Cl.
CPC .......... *H01L 27/11573* (2013.01); *G11C 5/063* (2013.01); *H01L 27/1052* (2013.01); *H01L 27/11526* (2013.01); *H01L 27/11531* (2013.01); *H01L 21/823468* (2013.01); *H01L 29/665* (2013.01); *H01L 29/66507* (2013.01)

(58) Field of Classification Search
CPC .................. H01L 29/665; H01L 29/66507
See application file for complete search history.

(56) References Cited

U.S. PATENT DOCUMENTS

| | | | |
|---|---|---|---|
| 6,809,018 B2 | 10/2004 | Chung | |
| 2003/0111695 A1* | 6/2003 | Kanamori | 257/384 |
| 2005/0191833 A1* | 9/2005 | Chang et al. | 438/586 |
| 2006/0118858 A1* | 6/2006 | Jeon et al. | 257/321 |
| 2006/0261418 A1* | 11/2006 | Eitan et al. | 257/390 |
| 2007/0122968 A1* | 5/2007 | Sim et al. | 438/243 |
| 2007/0296052 A1* | 12/2007 | Lee et al. | 257/478 |

OTHER PUBLICATIONS

USPTO Final Rejection for U.S. Appl. No. 12/111,886 dated May 25, 2010; 13 pages.
USPTO Non-Final Rejection for U.S. Appl. No. 12/111,886 dated Nov. 9, 2009; 13 pages.
USPTO Notice of Allowance for U.S. Appl. No. 12/111,886 dated Sep. 16, 2010; 8 pages.

* cited by examiner

*Primary Examiner* — Ha Tran T Nguyen
*Assistant Examiner* — Aaron Dehne

(57) ABSTRACT

Methods and structures for reducing resistance in wordlines of an integrated circuit memory device are disclosed. In one embodiment, the method includes forming multiple columns of polycrystalline silicon for respective number of wordlines, forming core transistor junctions and periphery transistor junctions associated with the wordlines, performing a salicidation process for the periphery transistor junction and performing a salicidation process for the columns of polycrystalline silicon to from the wordlines with low resistance.

13 Claims, 8 Drawing Sheets

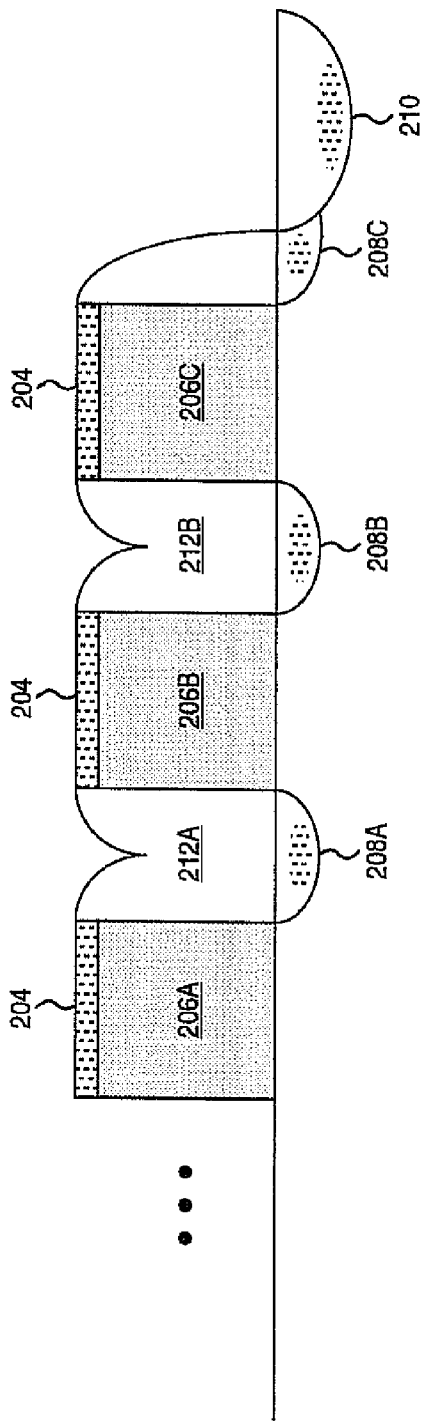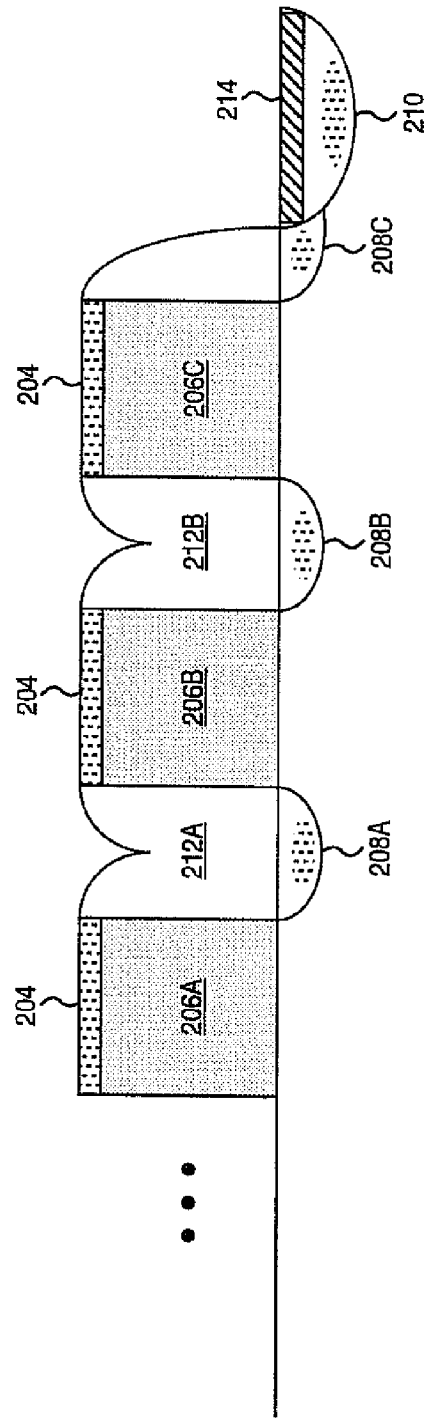

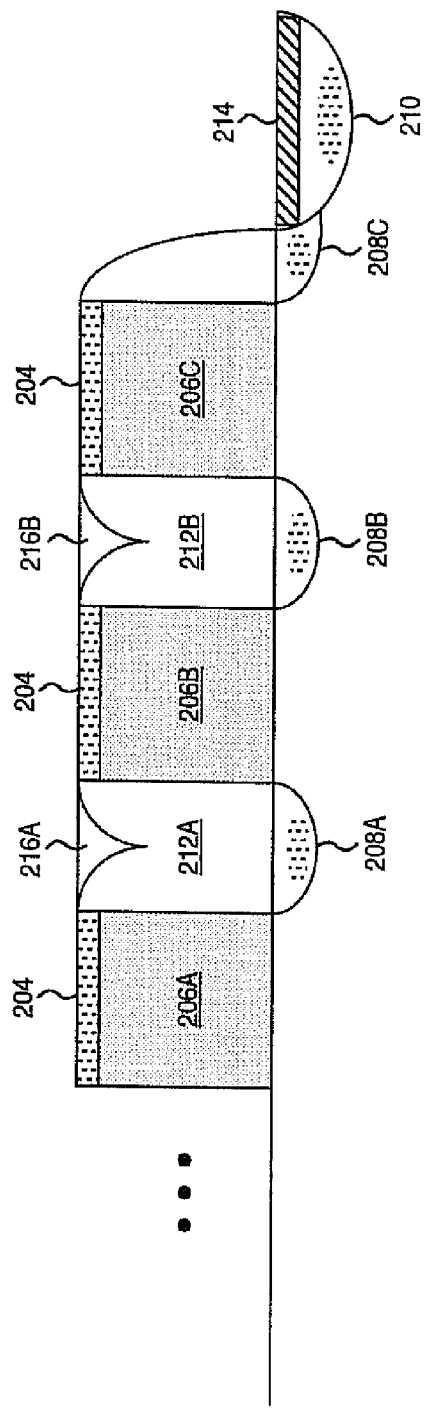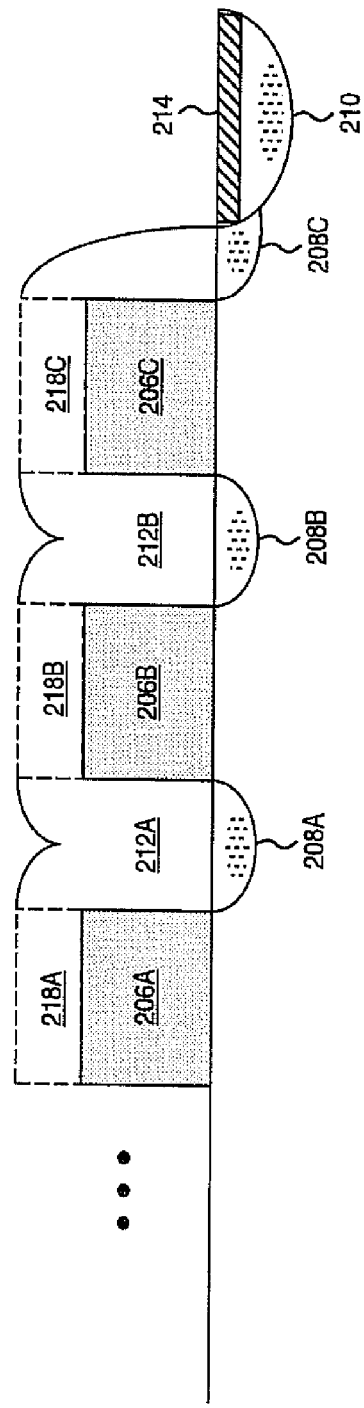

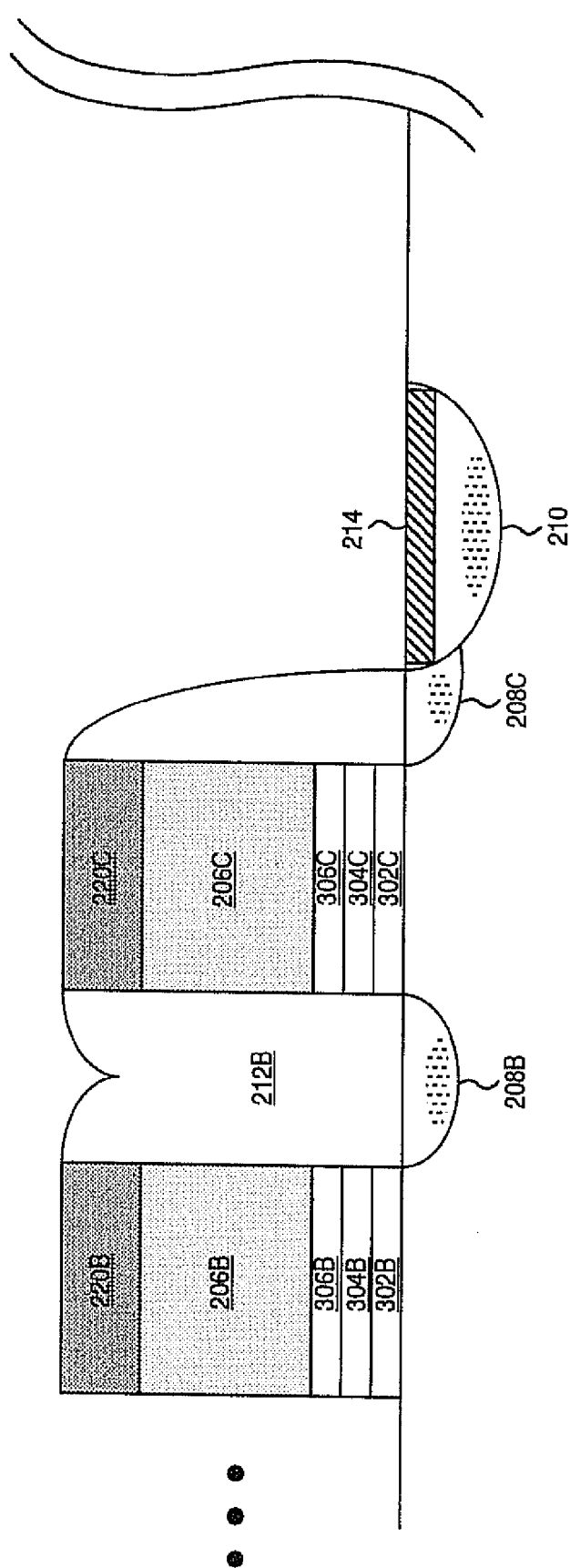

WORDLINE RESISTANCE REDUCTION METHOD AND STRUCTURE IN AN INTEGRATED CIRCUIT MEMORY DEVICE

CLAIM OF PRIORITY

This application is a Divisional of U.S. patent application Ser. No. 12/111,886, filed Apr. 29, 2008, the disclosure of which is thereby incorporated by reference.

FIELD OF TECHNOLOGY

This disclosure relates generally to technical fields of semiconductor manufacturing, in one embodiment, to a method and structure of improving performance of an integrated circuit memory device.

BACKGROUND

In an integrated circuit memory device (e.g., silicon-based), a polycrystalline silicon is used as a preferred material for forming a gate pedestal in field effect transistors (FETs). As long as the integrated circuit memory device is relatively large (e.g., where a critical dimension of the integrated circuit memory device greater than 0.5 microns), additional circuit lines (e.g., a gate line) may be made using the polycrystalline silicon (e.g., in a layer) used for forming the gate pedestal. However, when the integrated circuit memory device shrinks, resistance of the gate pedestal based on the polycrystalline silicon alone may be too high.

In order to lower the resistance (e.g., without the additional circuit lines), a transition metal (e.g., nickel, cobalt) may be deposited on top of source/drain silicon or the gate pedestal made of the polycrystalline silicon and/or annealed to form a silicide. The silicide is a compound of the transition metal and the source/drain silicon or the polycrystalline silicon of the gate. However, a photo mask needed to form the silicide may not be viable when the integrated circuit memory device is scaled.

Alternatively, a self-aligned silicide (e.g., salicide) may be used to lower the resistance in the integrated circuit memory device as the salicide does not require a lithographic patterning process. In a typical salicide process, the transition metal may be deposited over the FETs formed on a wafer. Then, the wafer is heated to allow the transition metal to react with silicon in active regions (e.g., sources, drains, and/or gates) of the wafer. Once the salicide process is completed, any remaining transition metal may be removed by chemical etching.

For the salicide to be effective in lowering the resistance, the compound being formed (e.g., as the product of the salicide) has to be thick (e.g., hundreds angstroms). However, the thick salicide may cause a defect in junction areas and lead to high junction leakage and malfunction of the IC. For example, roughness of the thick salicide may short the junction. A deeper junction may be used to accommodate the thick salicide, but the deeper junction increases the dimension of the junction area, thus resulting in increase in the die size.

SUMMARY

The requirement for wordline/gate and source/drain are different. For high speed operation, the wordline/gate resistance needs to be very low. Smaller wordline/gate critical dimension may dictate the wordline/gate resistance for a given salicide process technique. This invention uses separate processes for the wordline/gate and source/drain to achieve low resistance of the wordline/gate while optimizing the salicide process for the source/drain to prevent defects the thick salicide may cause to the source/drain junctions.

An embodiment described in the detailed description is directed to a method for low resistance wordline formation in an integrated circuit memory device by forming multiple columns of polycrystalline silicon for respective number of wordlines, forming core transistor junctions and periphery transistor junctions associated with the wordlines, performing a salicidation process for the periphery transistor junction and performing a salicidation process for the columns of polycrystalline silicon to from the wordlines with low resistance.

As illustrated in the detailed description, other embodiments pertain to methods and structures that provide an improved fabrication process of the integrated circuit memory device, and in particular, a reduction of resistance in wordlines of the integrated circuit memory device. By using a selective salicide process, the embodiments provide integrated circuit memory devices with a reduced wordline resistance.

BRIEF DESCRIPTION OF THE DRAWINGS

Example embodiments are illustrated by way of example and not limitation in the figures of the accompanying drawings, in which like references indicate similar elements and in which:

FIGS. 2(A) through 2(G) illustrate process steps of a semiconductor process for fabricating low resistance wordlines, according to one embodiment.

FIG. 3 is a cross sectional view of wordlines with core and transistor junctions, according to one embodiment.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, embodiments reduce the resistance of integrated circuit memory device by saliciding the wordline/gates. Instead of implementing a typical salicidation process, the embodiments include saliciding the wordlines/gates for low resistance while preventing the transition metal reacting with silicon junction areas. This is made possible by an etching process which forms recesses exclusively on top surfaces of the wordlines.

Figure 1:
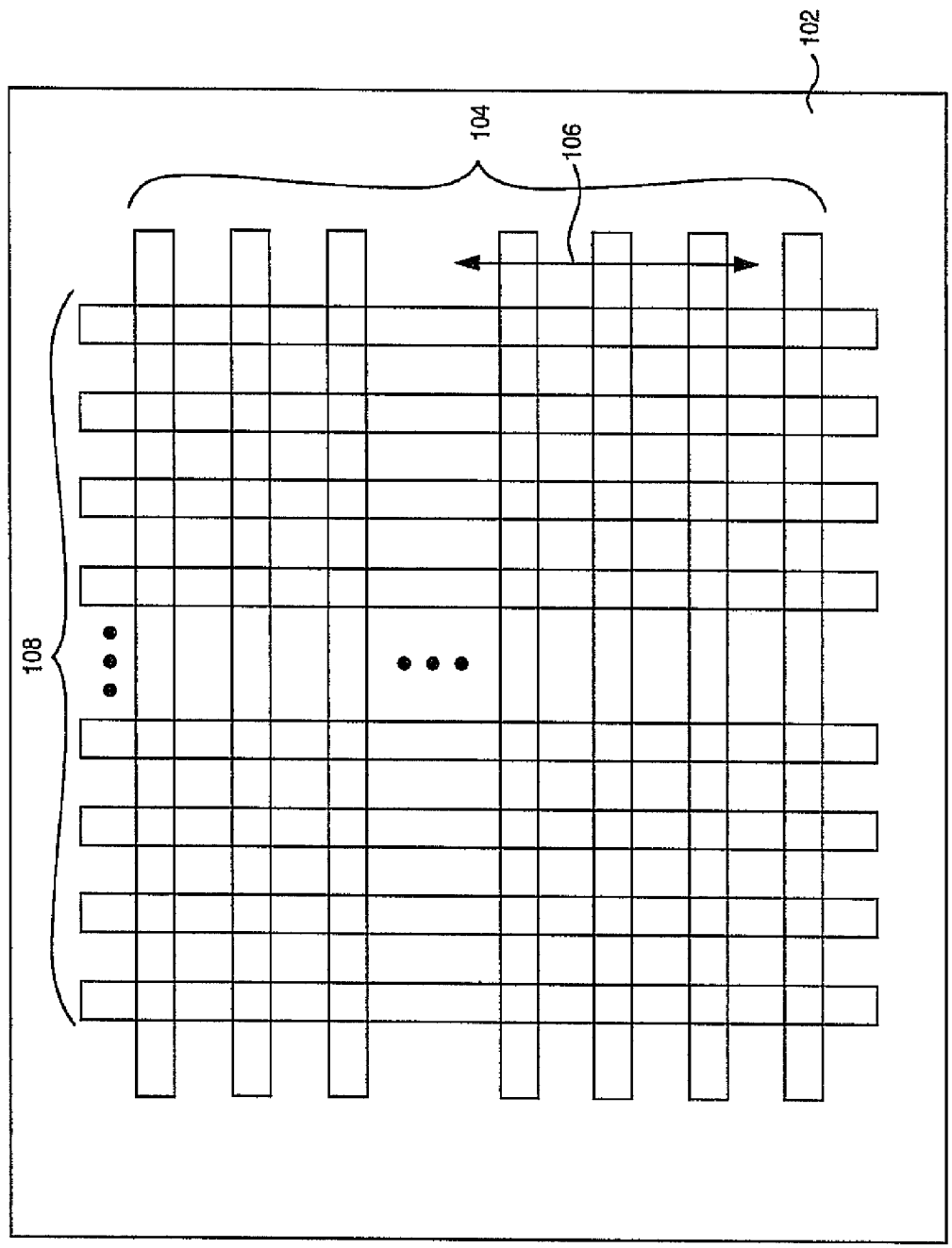
FIG. 1 is a plain view of a memory cell array of an integrated circuit memory device, according to one embodiment.

FIG. 1 is a plain view of a memory cell array of an integrated circuit memory device, according to one embodiment. The memory cell array may include individually addressable, substantially identical flash memory cells. Although not shown, an integrated circuit memory device may also include one or more peripheral areas (e.g., input/output circuitry, programming circuitry, etc.) for selectively addressing the individual memory cells. FIG. 1 illustrates a semiconductor substrate 102 having multiples of wordlines 104 at right angles to multiples of bit lines 108.

The wordlines 104 and the bit lines 108 may be used to communicate a signal to write, read, and/or erase bits stored to the individual memory cells. The wordlines 104 are coupled to respective control gates or act as the control gates. The bit lines 108 are connected to the drains and sources of the individual memory cells. In one example embodiment, the wordlines 104 may be treated with a self-aligned silicide (e.g., a salicide) process by selectively etching top surfaces of the wordlines to lower their resistance, as will be illustrated in details in FIGS. 2(A) through 2(G).

In another example embodiment, a wordline structure formed as the result of the salicide process may include one or more silicon gates of memory cells (e.g., a ROM, a PROM, a EPROM, a EEPROM, a flash memory, a RAM, a DRAM, etc.) and multiple wordlines communicating one or more wordline signals coupled to the silicon gates. Additionally, the wordlines are formed by the salicide (e.g., with an annealing step) process or a metallization (e.g., without involving the annealing step) process (e.g., to reduce resistance of the wordlines).

FIGS. 2(A) through 2(G) illustrate process steps of a semiconductor process for fabricating low resistance wordlines, according to one embodiment. In step FIG. 2(A), a wordline layer 202 is formed by depositing a polycrystalline silicon over transistors (e.g., which are formed on a wafer). In addition, a hard mask 204 (e.g. nitride) is formed above the wordline layer 202.

Figure 2A:
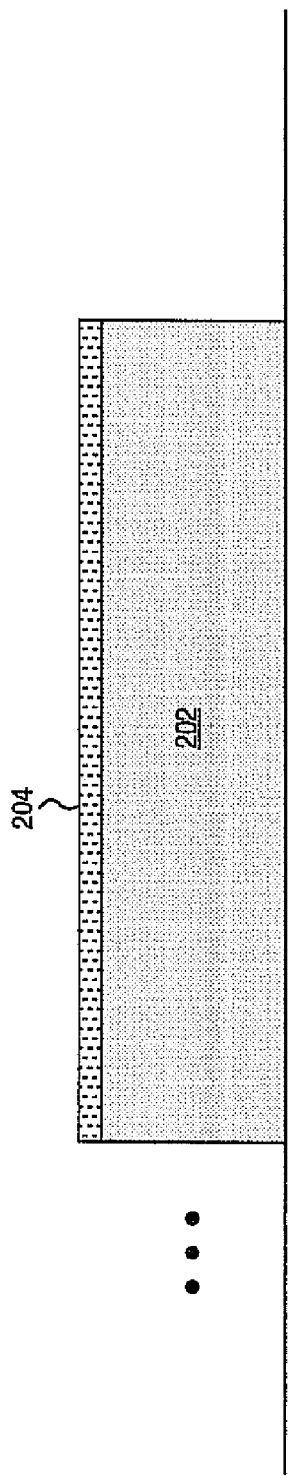
Figure 2B:
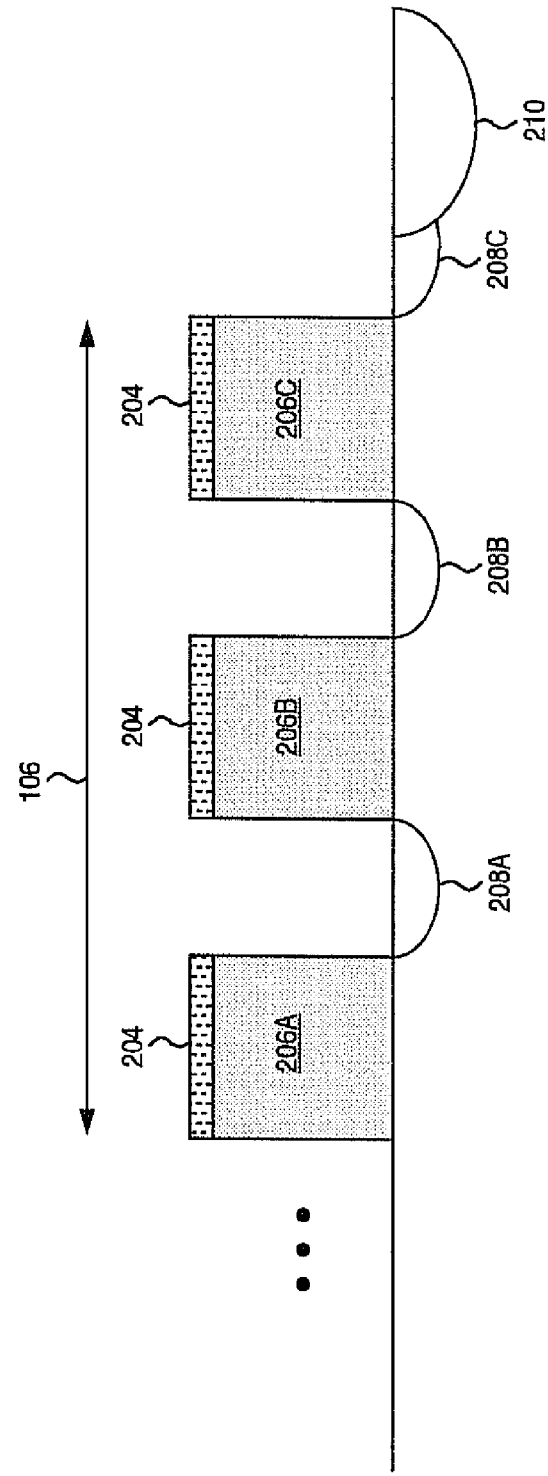

In FIG. 2(B), wordlines/gates (e.g., a wordline 206A, a wordline 206B, a wordline 206C, etc.), are formed (e.g., along a y-direction 106 of FIG. 1) by a photolithography and an etch process. Source/drain junctions for the core (e.g., a source/drain junction 208A, a source/drain junction 208B, a source/drain junction 208C, etc.) are formed by implants. The nitride 204 used as the mask material is still present on top of the wordlines/gates.

After a diffusion and/or implant process is performed on the junction areas of the core and periphery, a spacer material (e.g., an oxide, nitride or another insulating material) is deposited over the wordlines/gates and is etched back to form the spacer 212A, 212B, and 212C, and to expose the nitride 204 above the wordlines/gates, as illustrated in FIG. 2(C). As shown in FIG. 2(C), depressions (e.g., a gorge, a valley, etc.) are formed on the surfaces of the spacers. After the spacer formation, the memory cell contact and periphery areas 210 is formed by another implant with higher doping than 208A, 208B, and 208C.

In FIG. 2(D), a transition metal (e.g., nickel or cobalt) is applied above the memory cell and periphery transistor contact areas 210 and annealed to form a salicide 214 (e.g., a nickel or cobalt silicon salicide). During this salicidation process, the thickness of the metal is chosen such a way to provide optimal resistance while preventing it from shorting the junction areas.

In FIG. 2(E), an etch stop layer (e.g., which is not shown in the figures) may be deposited by a thermal treatment and/or a chemical vapor deposition over the wordlines/gates and the spacers. The etch stop layer may be any one or a combination of a silicon nitride, an oxynitride, and a silicon oxynitride. Then, an oxide layer is deposited above the etch stop layer. The oxide layer may be a silicon oxide or other type of oxide.

Next, a chemical-mechanical planarization (CMP) process may be performed to remove the oxide layer over the wordlines. The chemical-mechanical planarization is a technique used in semiconductor fabrication for planarizing the top surface of an in-process semiconductor wafer or other substrate. Because of the nature of the CMP process, parts or remnants of the oxide layer hidden in the depressions (e.g., a remnant 216A, a remnant 216B, etc.) and in wide spacing or open area (e.g. 216C) still remain on top surfaces of the spacers.

In FIG. 2(F), the etch stop layer of the top surfaces of the wordlines/gates is removed by a dry etching process with a high selectivity of the etch stop layer over the oxide layer. The selectivity refers to the ability of an etching agent to etch away only the material intended for removal, while leaving all other materials intact. The agent used must not attack the mask material over the material being etched as well as the material beneath it. Accordingly, an agent selected for the dry etching process removes only the etch stop layer on top surfaces of the wordlines/gates while the remnant of the oxide layer (e.g., interlayer dielectric layer 216A, 216B, and 216C) present on the depressions prevents the agent from etching away the etch stop layer on top surfaces of the spacers since the etch stop layer is between the remnants of the oxide layer and the spacers.

In addition, another dry etching process or the same etch step as above is performed to remove top surfaces of the wordlines/gates, thus forming recesses (e.g., 218A, 218B, 218C, etc.) in the wordlines/gates. In this case, the agent for the dry etching process is selected such that the top surfaces of the wordlines/gates (e.g., made of the polycrystalline silicon) is etched without etching away the top surfaces of the spacers 212A, 212B, 212C and insulation layer 216A, 216B and 216C.

Figure 2G:
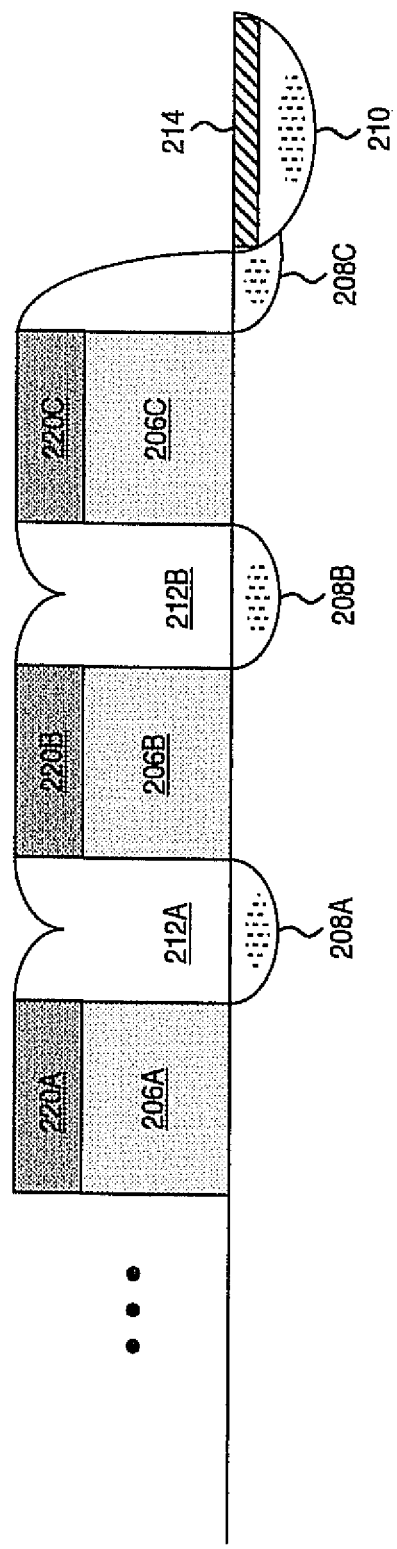

In FIG. 2(G), a transition metal (e.g., a transition metal 220A, a transition metal 220B, a transition metal 220C, etc.) may be deposited to fill the recesses (e.g., a recess 218A, a recess 218B, a recess 218C, etc. in FIG. 2 (F)). In one example embodiment, the transition metal includes a cobalt, a nickel, a platinum, a titanium, and/or a tungsten. Once the transition metal is deposited, the transition metal and the polycrystalline below it may be annealed to salicide the wordlines/gates. In another example embodiment, a metal may be deposited to fill the recesses instead. The metal deposited to fill the recesses may be polished without being annealed.

FIG. 3 is a cross sectional view of wordlines with core and transistor junctions, according to one embodiment. FIG. 3 illustrates wordlines neighboring an open area. The open area may be memory cell contact area or peripheral area (e.g., the input/output circuitry, the programming circuitry, etc.) and/or the junction area 210. As illustrated in FIG. 3, the salicides of the wordlines/gates can be configured thicker than the salicide 214 when two separate salicidation processes are used for the wordlines/gates and contact areas.

Although low resistance is desirable for both the wordlines/gates and source/drain of transistor, the requirement is different from one another. In general, the resistance for the wordlines/gates needs to be as low as possible, thus prompting to have a thicker salicide. However, as for the source/drain, thicker transition metal or metal may short the junction, thus causing malfunction of the device. Thus, the embodiments illustrated in FIG. 3 describe two salicides (e.g., 220B and 220C versus 214) having two distinct thicknesses formed by two separate salicidation processes.

In an alternative embodiment, salicide 214 formation can be skipped if the open area or regions do not require salicide in some applications as illustrated in FIG. 2(F). It is also appreciated that a floating gate based on a nitride or any other charge trapping layer (e.g., 304B, 304C, etc.) may be formed between a top oxide layer (e.g., 306B, 306C, etc.) and a bottom oxide layer (e.g., 302B, 302C, etc.) prior to the formation of the polysilicon layer (e.g., 206B, 206C, etc.).

Figure 4:
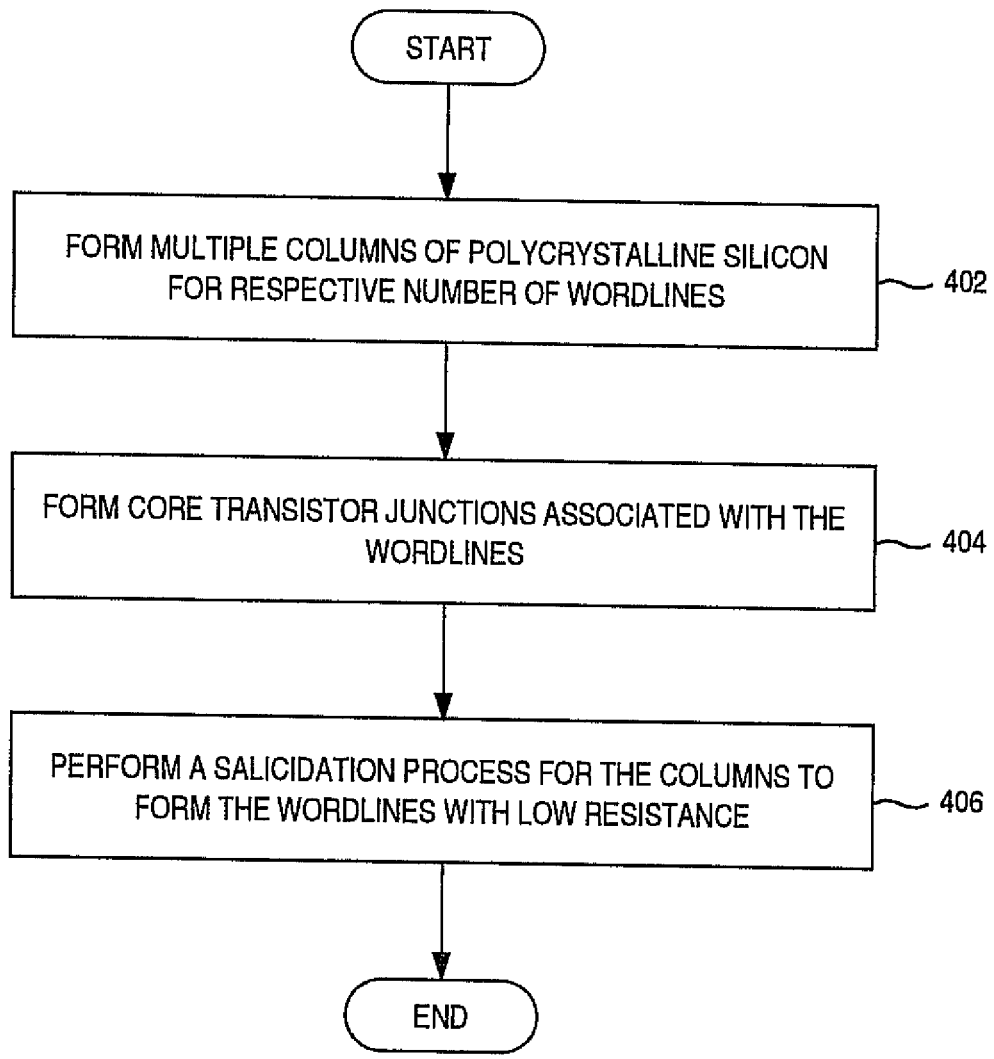
FIG. 4 is a process flow chart for forming low resistance wordlines, according to one embodiment.

FIG. 4 is a process flow chart for forming low resistance wordlines, according to one embodiment. In operation 402, multiple columns of polycrystalline silicon are formed to construct respective number of wordlines. In one exemplary embodiment, the operation is performed by depositing polycrystalline silicon over floating gates or charge trapping film stack of memory cells of an integrated circuit memory device to form a wordline layer and masking and etching the wordline layer to form the columns of polycrystalline silicon and gaps in between the columns.

In operation 404, periphery transistors junctions and core transistor junctions associated with the wordlines are formed. In addition, after spacer is formed, a high dose of impurities (e.g., electrons, holes etc.) are implanted to the periphery and the core transistor contact junctions. In operation 406, a salicidation process is performed for the columns of polycrystalline silicon to form the wordlines with low resistance, where other regions except the columns of polycrystalline silicon are shielded from the salicidation process.

In one exemplary embodiment, the salicidation process comprises forming respective oxide spacers by depositing a spacer material to the gaps in between the columns of polycrystalline silicon to provide an insulation between adjacent ones of the wordlines, forming respective recesses in the columns of polycrystalline silicon by etching top surfaces of the columns and filling the respective recesses with a transition metal (e.g., which comprises one or more of cobalt, nickel, platinum, titanium and tungsten) or a metal. The salicidation process further comprises annealing the polycrystalline silicon and the transition metal.

Moreover, a chemical-mechanical planarization process may be performed if the metal is used for the salicidation process. In one exemplary embodiment, the top surfaces of the columns of polycrystalline silicon is selectively etched by depositing an etch stop layer (e.g., which is silicon nitride, oxynitride or silicon oxynitride) on top of the columns of polycrystalline silicon and on the oxide spacers, depositing a thick oxide layer on top of the etch stop layer, performing a chemical-mechanical planarization process to remove the thick oxide layer and performing a dry etching process with a high selectivity of a material forming the etch stop layer over another material forming the thick oxide layer and spacer.

The oxide spacers formed as the result of operation 402 comprise depressions formed on surfaces of the oxide spacers. Thus, remnants of the thick oxide layer buried in the depressions survive the chemical-mechanical planarization process. Accordingly, the dry etching process does not affect the remnants of the oxide layer buried in the depressions such that the oxide spacers are unscathed by the dry etching process.

Figure 5:
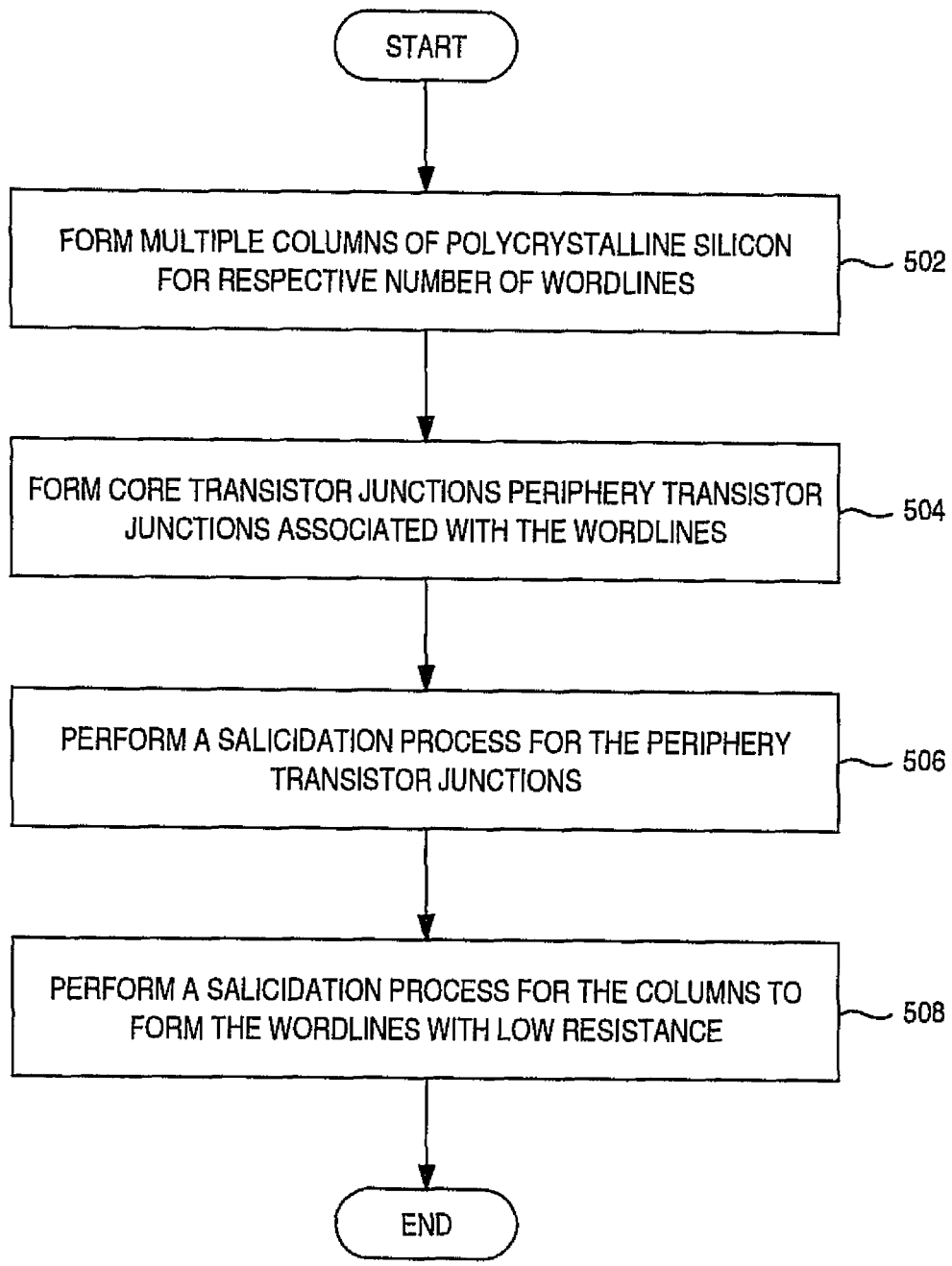
FIG. 5 is a process flow chart for separately salicidating the wordlines and periphery transistor junctions, according to one embodiment.

FIG. 5 is a process flow chart for separately salicidating the wordlines and periphery transistor junctions, according to one embodiment. In operation 502, multiple columns of polycrystalline silicon for corresponding number of wordlines are formed. In one exemplary embodiment, the polycrystalline silicon is deposited over gates of memory cells of an integrated circuit memory device to form a wordline layer and the wordline layer is masked and etched to form the columns of polycrystalline silicon and gaps in between the columns.

In operation 504, core transistor junctions and periphery transistor junctions (e.g., source, drain, etc.) are formed. In operation 506, a salicidation process for the periphery transistor junctions is performed. In one exemplary embodiment, a transition metal is deposited over the periphery transistor junction and/or core contact area and annealed.

In operation 508, a salicidation process for the wordlines is performed. In one exemplary embodiment, the salicidation process for the wordlines comprises forming respective oxide spacers in between the columns of polycrystalline silicon to provide an insulation between adjacent ones of the wordlines, forming respective recesses in the columns of polycrystalline silicon by selectively etching top surfaces of the columns and filling the respective recesses with a transition metal or a metal.

In one exemplary embodiment, the columns of polycrystalline silicon are selectively etched to form recesses by depositing an etch stop layer on top of the columns of polycrystalline silicon and the respective oxide spacers, depositing a thick oxide layer on top of the etch stop layer, performing a chemical-mechanical planarization process to remove the thick oxide layer and performing a dry etching process with a high selectivity of a material forming the etch stop layer over another material forming the thick oxide layer and the spacer. It is appreciated that the salicidation process for the periphery transistor junctions and core junctions in contact areas is separately performed from the salicidation process for the wordlines in operations 502 through 508

In summary, embodiments described herein pertain to methods and structures that reduce resistance in integrated circuit memory devices, and in particular, the wordline resistance. By separately salicidating the wordlines and periphery components, the embodiments reduce the wordline resistance of the device while minimizing the effect of the salicidation process have on the periphery components, thus improving the control and/or access of the device while preserving energy.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A wordline structure, comprising:
 a plurality of wordlines formed to include an ONO layer that is formed parallel to and directly contacting a substrate, the substrate comprising a plurality of source/drain regions having a first impurity implantation dosage; and
 a plurality of respective oxide spacers disposed above respective source/drain regions of the plurality of source/drain regions and between wordlines to provide an insulation between adjacent wordlines, wherein each respective oxide spacer comprises a depression formed on a surface of the respective oxide spacer, wherein each respective oxide spacer contacts two adjacent wordlines to fill a space between the two adjacent wordlines, wherein the plurality of wordlines comprise a first salicide are formed by a first salicidation process while shielding other regions from being subjected to the same first salicidation process, and wherein a peripheral region adjacent to the plurality of wordlines has a second impurity implantation dosage that is greater than the first impurity implantation dosage, and comprises a second salicide formed by a different second salicidation process, wherein said first salicide has a first thickness that is greater than a second thickness of said second salicide.

2. The wordline structure of claim 1, wherein the salicidation process of the plurality of wordlines reduces resistance formed on the plurality of wordlines.

3. The wordline structure of claim 1, wherein the salicidation process comprises:
 respective oxide spacers formed in between a plurality of columns of polycrystalline silicon to provide an insulation between adjacent ones of the wordlines;
 respective recesses formed in the plurality of columns of the polycrystalline silicon by selectively etching top surfaces of the plurality of columns, wherein the respective recesses are filled with a transition metal or a metal.

4. The wordline structure of claim 3, wherein the polycrystalline silicon and the transition metal or metal are annealed until the salicidation process is completed.

5. The wordline structure of claim 3, wherein the transition metal comprises one of cobalt, nickel, platinum, titanium and tungsten.

6. The wordline structure of claim 3, wherein a chemical-mechanical planarization process is utilized when the metal is used.

7. A wordline structure, comprising:
 a plurality of wordlines formed to include an ONO layer that is formed parallel to and directly contacting a substrate, the substrate comprising a plurality of source/drain regions having a first impurity implantation dosage;
 a spacer material disposed above respective source/drain regions of the plurality of source/drain regions and deposited between each of the plurality of wordlines, wherein each respective spacer material comprises a depression formed on a surface of the respective spacer material, wherein a first spacer material contacts two adjacent wordlines to fill a space between the two adjacent wordlines; and
 a transition metal deposited on each of the plurality of wordlines, wherein the transition metal is annealed to salicide the plurality of wordlines comprising a first silicide by a first salicidation process, and wherein other regions are not subjected to the same first salicidation process, and wherein a peripheral region adjacent to the plurality of wordlines has a second impurity implantation dosage that is greater than the first impurity implantation dosage, and comprises a second salicide formed by a different second salicidation process, wherein said first silicide has a first thickness that is greater than a second thickness of said second salicide.

8. The wordline structure of claim 7, wherein the spacer material comprises one of oxide, nitride, and other insulating material.

9. The wordline structure of claim 7, wherein the transition metal comprises one of cobalt, nickel, platinum, titanium and tungsten.

10. The wordline structure of claim 7, wherein the transition metal is deposited on the plurality of wordlines to fill recesses between each spacer material.

11. The wordline structure of claim 7, wherein the salicides of plurality of wordlines are thicker than the salicides of at least one of the other regions.

12. The wordline structure of claim 7, wherein the salicidation process of the plurality of wordlines reduces resistance formed on the plurality of wordlines.

13. The wordline structure of claim 7, wherein the salicidation process comprises:
 respective oxide spacers formed in between a plurality of columns of polycrystalline silicon to provide an insulation between adjacent ones of the wordlines;
 respective recesses formed in the plurality of columns of the polycrystalline silicon by selectively etching top surfaces of the plurality of columns, wherein the respective recesses are filled with a transition metal or a metal.

* * * * *